(12) United States Patent
Lo et al.

(10) Patent No.: US 11,706,913 B2
(45) Date of Patent: Jul. 18, 2023

(54) METHOD FOR MANUFACTURING SEMICONDUCTOR MEMORY DEVICE

(71) Applicant: NANYA TECHNOLOGY CORPORATION, New Taipei (TW)

(72) Inventors: Hao-Chan Lo, New Taipei (TW); Hsing-Han Wu, New Taipei (TW); Jr-Chiuan Wang, New Taipei (TW); Jen-I Lai, Taoyuan (TW); Chun-Heng Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 84 days.

(21) Appl. No.: 17/546,657

(22) Filed: Dec. 9, 2021

(65) Prior Publication Data

US 2023/0189507 A1 Jun. 15, 2023

(51) Int. Cl.
*H01L 27/108* (2006.01)
*H10B 12/00* (2023.01)

(52) U.S. Cl.
CPC .................................. *H10B 12/482* (2023.02)

(58) Field of Classification Search
CPC ................................................... H10B 12/482
See application file for complete search history.

(56) References Cited

U.S. PATENT DOCUMENTS

| | | | |
|---|---|---|---|
| 2019/0013321 A1* | 1/2019 | Chang | H10B 12/485 |
| 2020/0388620 A1 | 12/2020 | Park et al. | |
| 2021/0066304 A1* | 3/2021 | Kang | H10B 12/0335 |
| 2021/0296321 A1 | 9/2021 | Heo et al. | |

FOREIGN PATENT DOCUMENTS

| | | |
|---|---|---|
| CN | 110718550 A | 1/2020 |
| CN | 112514069 A | 3/2021 |
| TW | I708372 B | 10/2020 |
| TW | 202141701 A | 1/2021 |

OTHER PUBLICATIONS

Office Action corresponding to TW Application No. 11121086710 dated Nov. 3, 2022 11 pages.
Office Action corresponding to TW Application No. 11121104900 dated Nov. 8, 2022, 4 pages.

* cited by examiner

*Primary Examiner* — Mohammed R Alam

(74) *Attorney, Agent, or Firm* — Muncy, Geissler, Olds & Lowe, P.C.

(57) ABSTRACT

The present disclosure provides to a method for manufacturing a semiconductor memory device. The method includes receiving a substrate including a cell area and a peripheral area; forming a first bit line structure on a surface of the cell area; depositing a landing pad above the barrier layer and on the top surface of the first bit line structure; removing a top corner of the landing pad to form an inclined surface connecting a top surface of the landing pad to a sidewall of the landing pad; etching the nitride layer of the first bit line structure and the spacer nitride layer from the top opening so as to form a concavity;

etching the spacer oxide layer from the concavity to form an air gap; and depositing a silicon nitride layer to seal the air gap.

19 Claims, 16 Drawing Sheets

US 11,706,913 B2

METHOD FOR MANUFACTURING SEMICONDUCTOR MEMORY DEVICE

TECHNICAL FIELD

The present disclosure relates to a method for manufacturing a semiconductor memory device, and more particularly, to a method for manufacturing a semiconductor memory device with a bit line structure sandwiched by a pair of air gaps for reducing current leakage.

DISCUSSION OF THE BACKGROUND

Semiconductor devices are widely used in electronics industries. Semiconductor devices may have relatively small sizes, multi-functional characteristics, and relatively low manufacturing costs. Semiconductor devices include semiconductor memory devices for storing logical data, semiconductor logic devices for processing logical data (e.g., random-access memory (RAM) and read-only memory (ROM)), and hybrid semiconductor devices performing the functions of both the semiconductor memory devices and the semiconductor logic devices.

In dynamic random-access memory (DRAM) devices, there is a serious problem associated with leakage current. Bonding between silicon oxide in an interlayer insulating layer of a device and silicon near an interface between a semiconductor substrate of the device and the interlayer insulating layer, or between a gate dielectric layer and silicon near an interface between a semiconductor substrate of the device and the gate dielectric layer results in the existence of an interface energy level, which causes a leakage current to flow from a diffusion layer to the semiconductor substrate. Such leakage current reduces performance characteristics of the DRAM.

Normally, a semiconductor memory device comprises a cell area and a periphery area. FIGS. 1 to 6 provide illustrative 3D-perspective views and cross-sectional views of a cell area of a semiconductor memory device 10 with air gaps manufactured according to a conventional method of the prior art. As shown in FIG. 1, the semiconductor memory device 10 comprises a bit line structure 101 comprising a bit line tungsten 101a and a bit line nitride 101b, wherein the bit line structure 101 is disposed on and protrudes from a substrate of the semiconductor memory device 10. The bit line structure 101 further includes sidewalls SW1 and SW2 and an ascending top portion ATP1, wherein the ascending top portion ATP1 is connected to the sidewall SW2 of the bit line structure 101. The semiconductor memory device 10 further comprises a landing pad 103, disposed over the ascending top portion ATP1 and the sidewalls SW1 and SW2 of the bit line structure 101, wherein the landing pad 103 includes an inclined surface IS1 corresponding to the ascending top portion ATP1 of the bit line structure 101. The bit line structure 101 is sandwiched between a pair of spacers 105a and 105b. A spacer oxide 107 is disposed in each of the spacers 105a and 105b. After an etching step is performed using a chemical etchant (e.g., HF (hydrogen fluoride) vapor), a pair of air gaps AG1 and AG2 are formed within the spacers 105b and 105a, respectively (see FIG. 2). A size of an open area of the spacer oxide 107 determines a stability of the HF vapor etching process.

As used herein, the term "open area" refers to an area on a top of a laminated structure formed after being slightly etched. Please refer to FIGS. 2 and 3. A smaller open area 109 in the spacer oxide 107 leads to a longer HF vapor etching time and an insufficient air gap depth H1. The longer HF vapor etching time results in loss of nitride from the spacers 105a and 105b and the bit line nitride 101b in the cell area and a significant nitride loss from the nitride film in the periphery area.

Please refer to FIGS. 1 and 4. A larger spacer oxide open area 111 requires a longer dry-etching time for tungsten of the landing pad 103, which results in a greater etching depth DP1. A significant nitride loss in the nitride film of both of the cell area the periphery area leads to a sealed nitride topography in these two areas.

Please refer to FIGS. 1, 5 and 6. A greater height H2 of the spacer oxide 107 would result in a larger open area of the spacer oxide 107 and a reduction of the HF vapor etching time. However, the greater height H2 of the spacer oxide 107 would also cause the air gaps to be formed at a high position, which would lead to a shorter distance between a capacitor and an air gap and impact a process window of the capacitor due to a need to perform a dry-etching step for etching through the air gaps. As a result, metal nitride for the capacitor is deposited into the air gaps, and a current leakage between bit lines occurs. In addition, a greater air gap depth causes greater loss of the nitride, which leads to a sealed nitride topography in both of the cell area the periphery area. Such issues, therefore, raise a need for an additional patterning process to form separate cell and periphery areas.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a semiconductor memory device. The method comprises: receiving a substrate including a cell area and a peripheral area; forming a first bit line structure on a surface of the cell area, wherein the first bit line structure sequentially comprises a bit line contact disposed on the surface of the cell area, a tungsten layer disposed on the bit line contact, and a nitride layer disposed on the tungsten layer, the first bit line structure includes a top surface away from the substrate and two sidewalls connecting the top surface of the first bit line structure to the substrate, and the first bit line structure is sandwiched by a pair of spacers, wherein each spacer comprises a spacer oxide layer sandwiched by two spacer nitride layers, and wherein a barrier layer conformally overlays the spacers adjacent to the sidewalls of the first bit line structure and the cell area; depositing a landing pad above the barrier layer and on the top surface of the first bit line structure; removing a top corner of the landing pad to form an inclined surface connecting a top surface of the landing pad to a sidewall of the landing pad, wherein a top opening of the spacer is formed in the inclined surface; etching the nitride layer of the first bit line structure and the spacer nitride layer from the top opening using a hydrogen fluoride vapor to generate $(NH_4)_2SiF_{6(s)}$ so as to form a concavity; etching the spacer oxide layer from the concavity using a hydrogen fluoride vapor by controlling the vaporization rate of $(NH_4)_2SiF_{6(s)}$ to form an air gap; and depositing a silicon nitride layer to seal the air gap.

Another aspect of the present disclosure provides a method of manufacturing a semiconductor memory device.

The method comprises: receiving a silicon substrate including a cell area and a peripheral area; forming a first bit line structure on a surface of the cell area, wherein the first bit line structure sequentially comprises a bit line contact disposed on the surface of the cell area, a tungsten layer disposed on the bit line contact, and a nitride layer disposed on the tungsten layer, the first bit line structure has a top surface away from the substrate and two sidewalls connecting the top surface of the first bit line structure to the substrate, and the first bit line structure is sandwiched by a pair of spacers, wherein each spacer comprises a spacer oxide layer sandwiched by two spacer nitride layers, and wherein a barrier layer conformally overlays the spacers adjacent to the sidewalls of the first bit line structure and the cell area; performing an atomic layer deposition (ALD) to deposit a landing pad above the barrier layer and on the top surface of the first bit line structure; performing a directional etching to remove a top corner of the landing pad to form a concave surface with a top opening of the spacer formed in the concave surface; performing an anisotropic dry etch process to etch the nitride layer of the first bit line structure and the spacer nitride layer from the top opening using a hydrogen fluoride vapor to generate $(NH_4)_2SiF_{6(s)}$ so as to form a concavity; etching the spacer oxide layer from the concavity using a hydrogen fluoride vapor by controlling the vaporization rate of $(NH_4)_2SiF_{6(s)}$ to form an air gap; and depositing a silicon nitride layer to seal the air gap.

A further aspect of the present disclosure provides a semiconductor memory device. The semiconductor memory device comprises: a substrate including a cell area and a peripheral area; a first bit line structure, disposed on and protruding from a surface of the cell area, wherein the first bit line structure sequentially comprises a bit line contact disposed on the surface of the cell area, a tungsten layer disposed on the bit line contact, and a nitride layer disposed on the tungsten layer, wherein the first bit line structure has a sidewall and an ascending top portion, the sidewall of the first bit line structure connects the ascending top portion of the bit line structure to the surface of the cell area, the ascending top portion has a concavity facing the nitride layer of the first bit line structure, and the first bit line structure is sandwiched by a pair of air gaps; a barrier layer conformally overlaying the air gaps adjacent to the sidewalls of the first bit line structure and the cell area; and a landing pad, disposed over the ascending top portion and the sidewall of the first bit line structure, and having an inclined surface corresponding to the ascending top portion of the first bit line structure.

Due to the design of the method of the present disclosure, $(NH_4)_2SiF_{6(s)}$ is deposited on a top opening of a spacer. This chemical substance begins to decompose and surrounds the nitride layer of the first bit line structure and the spacer nitride layer so that the etching rate is enhanced. By controlling a vaporization rate of $(NH_4)_2SiF_{6(s)}$ in a subsequent step of etching the spacer oxide layer, a desired profile of an air gap can be obtained. As a result, problems encountered in the prior art, such as difficulties associated with a size of an open area of a spacer oxide, HF vapor etching time, current leakage and other issues are addressed by the method of the present disclosure. In addition, there is no need to use an additional patterning process to form separate cell and periphery areas for the method of the present disclosure.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
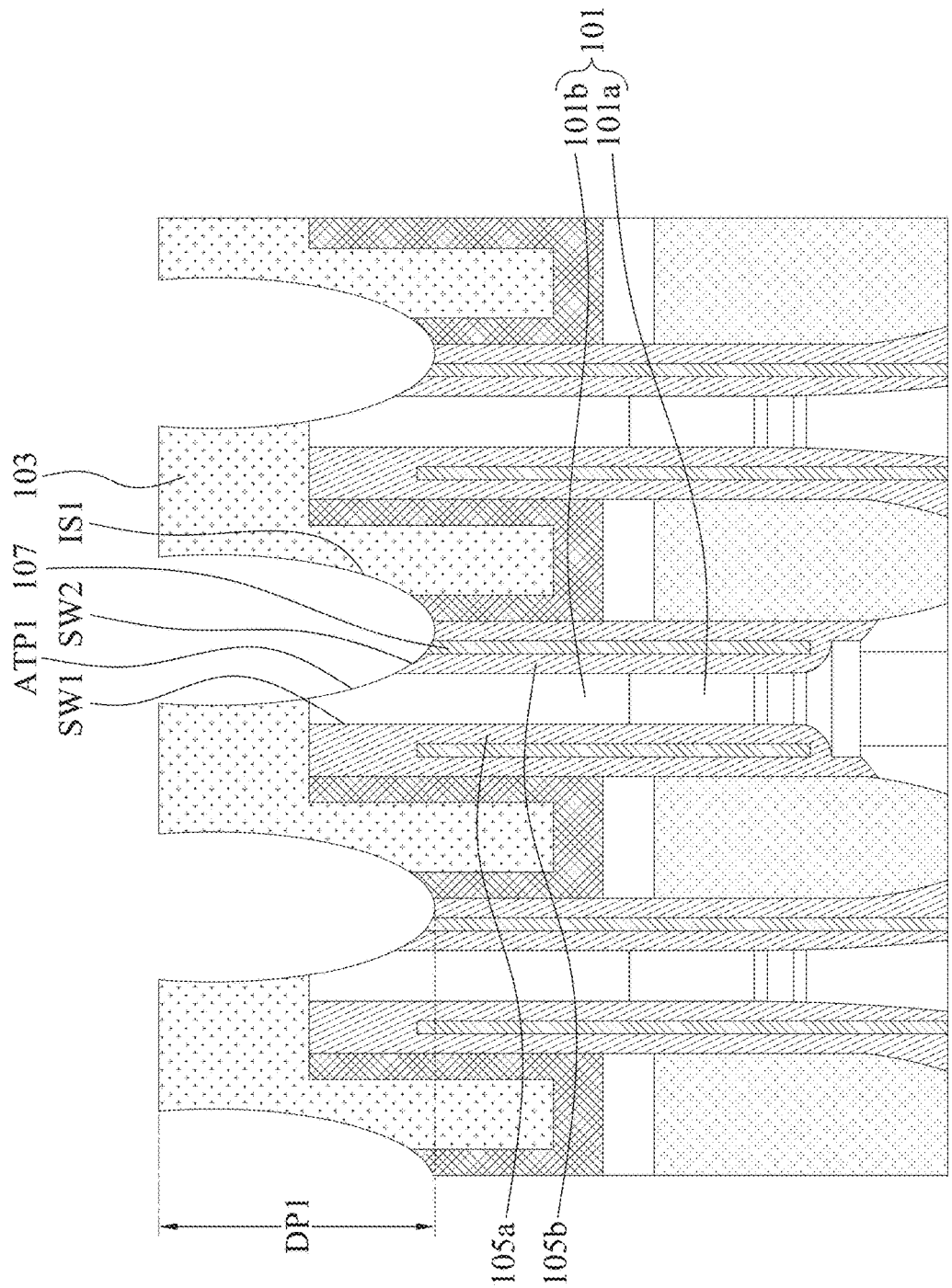
FIG. 1 is a cross-sectional view showing a portion of a semiconductor memory device of the prior art prior to the formation of an air gap.
Figure 2:
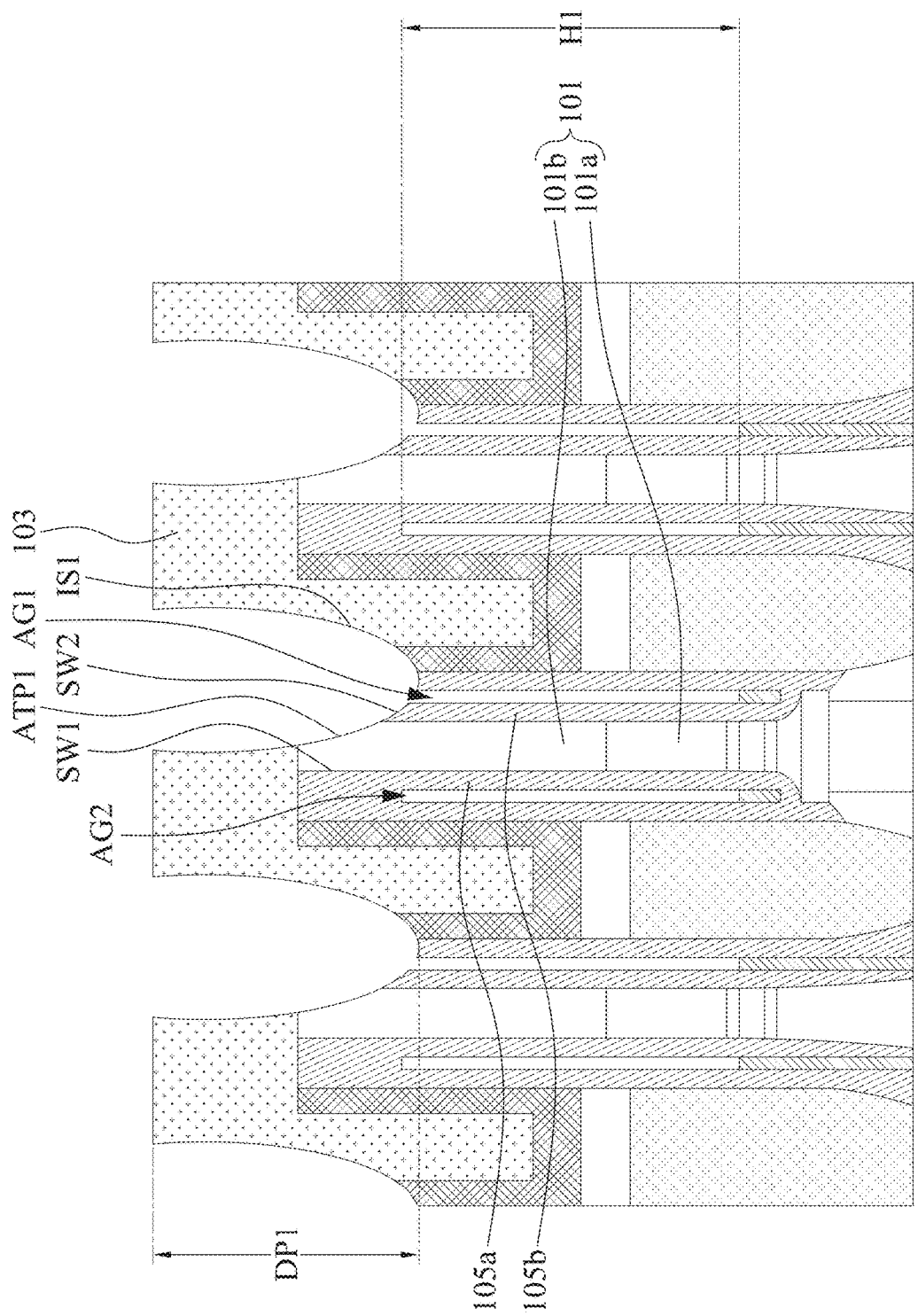
FIG. 2 is a cross-sectional view showing a portion of a semiconductor memory device of the prior art after the formation of an air gap.
Figure 3:
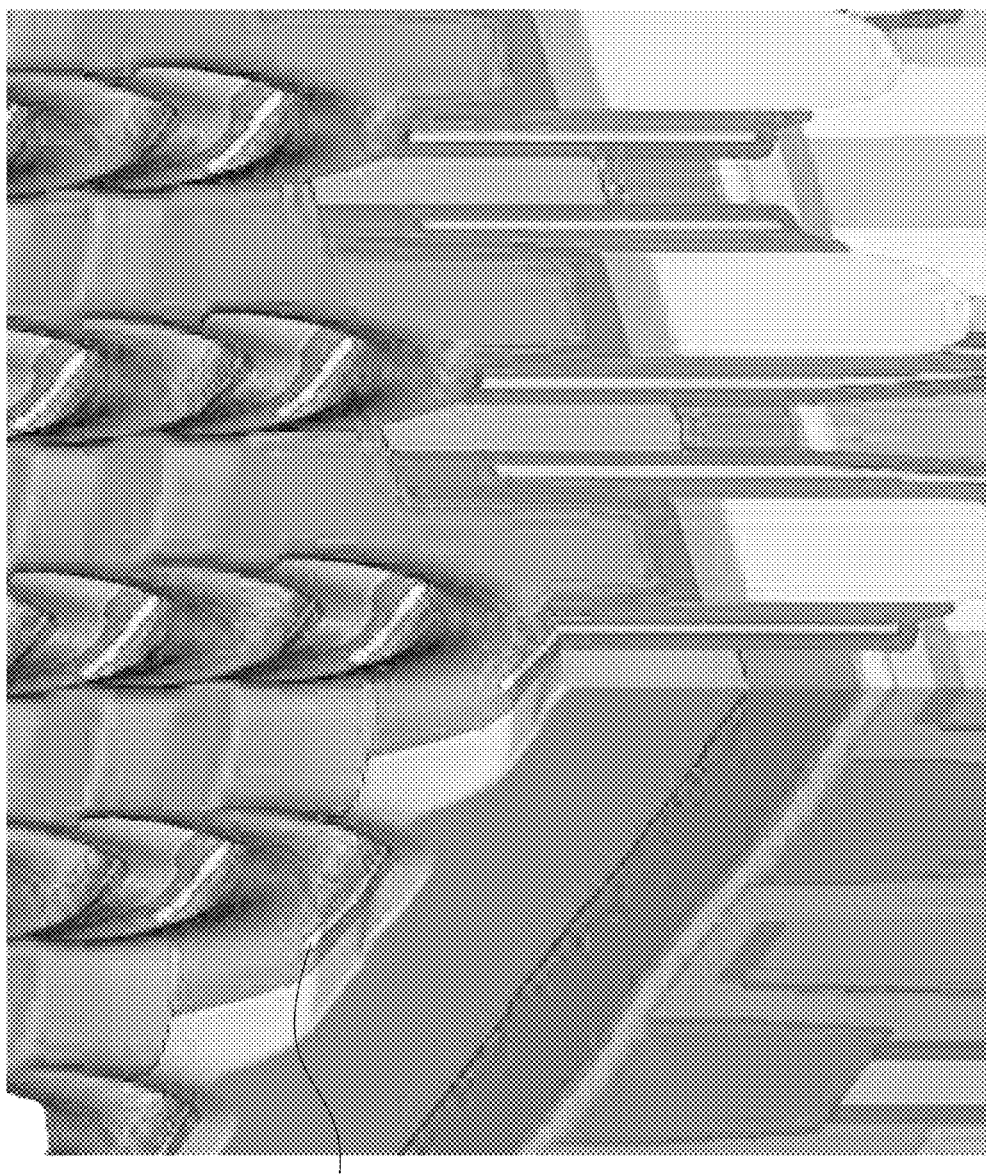
FIG. 3 is an illustrative 3D-perspective view of a semiconductor memory device of the prior art, which has a relatively small spacer oxide open area.
Figure 4:
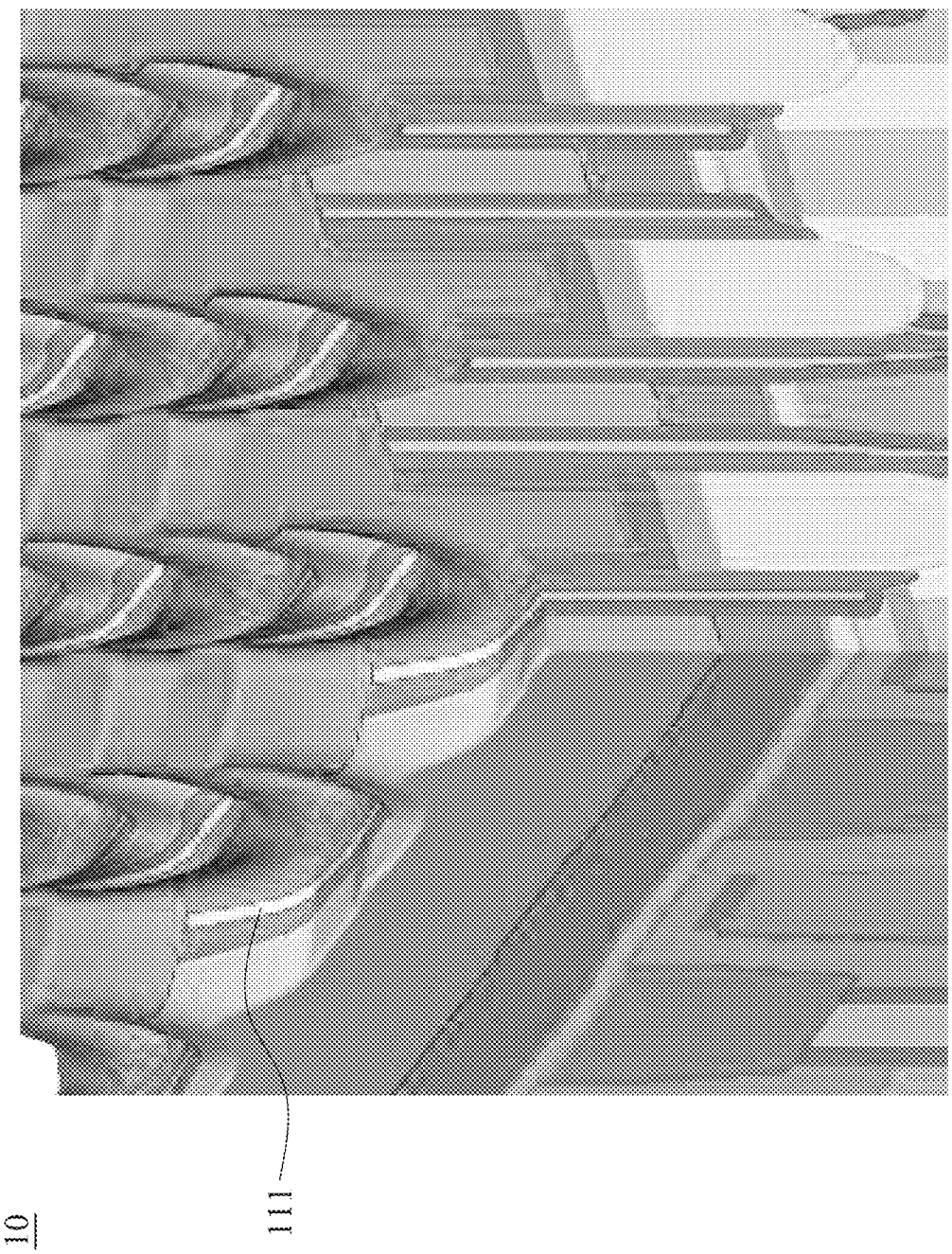
FIG. 4 is an illustrative 3D-perspective view of a semiconductor memory device of the prior art, which has a relatively large spacer oxide open area.
Figure 5:
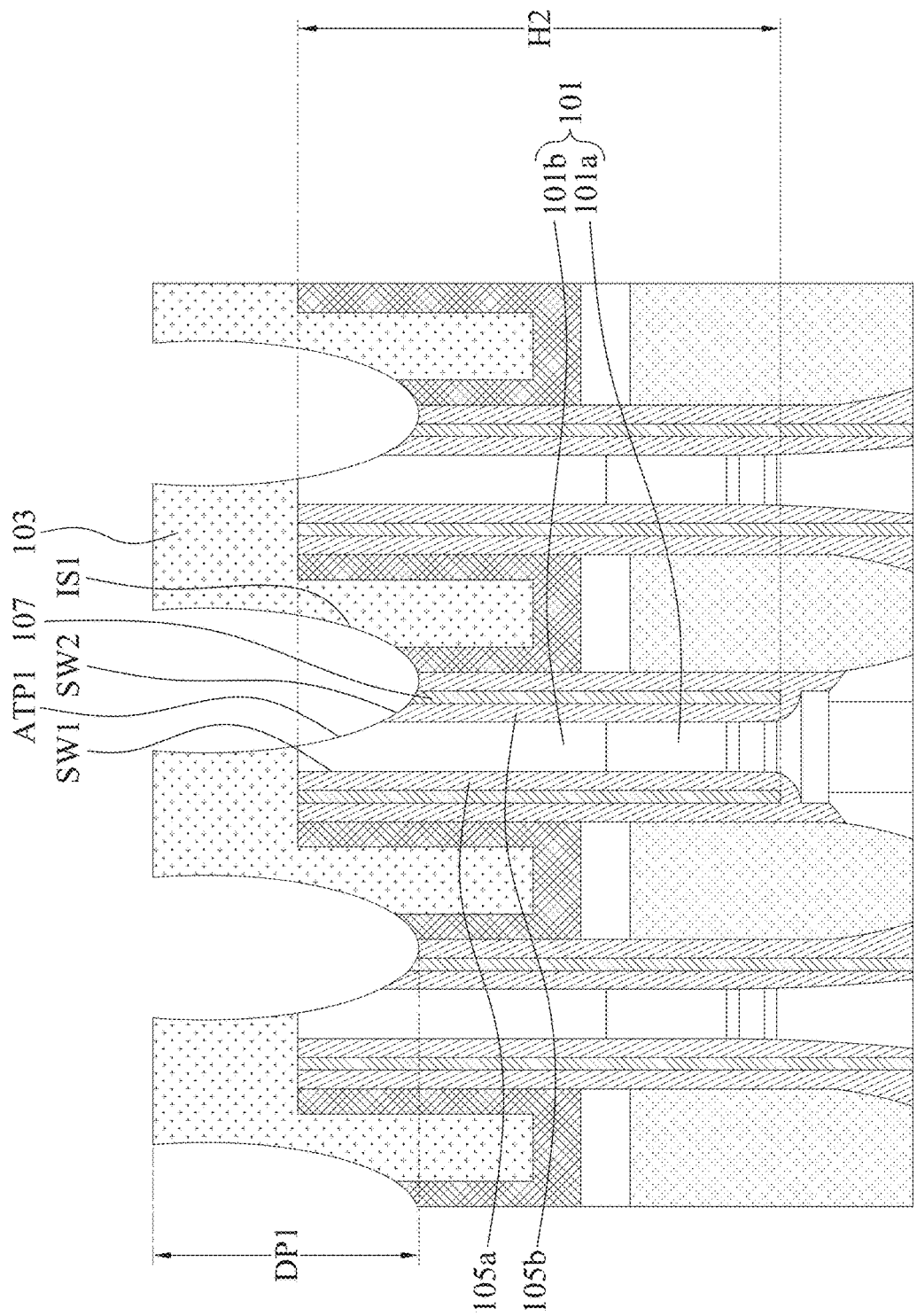
FIG. 5 is a cross-sectional view showing a portion of a semiconductor memory device of the prior art, which comprises a spacer oxide with a relatively large height H2 prior to the formation of an air gap.
Figure 6:
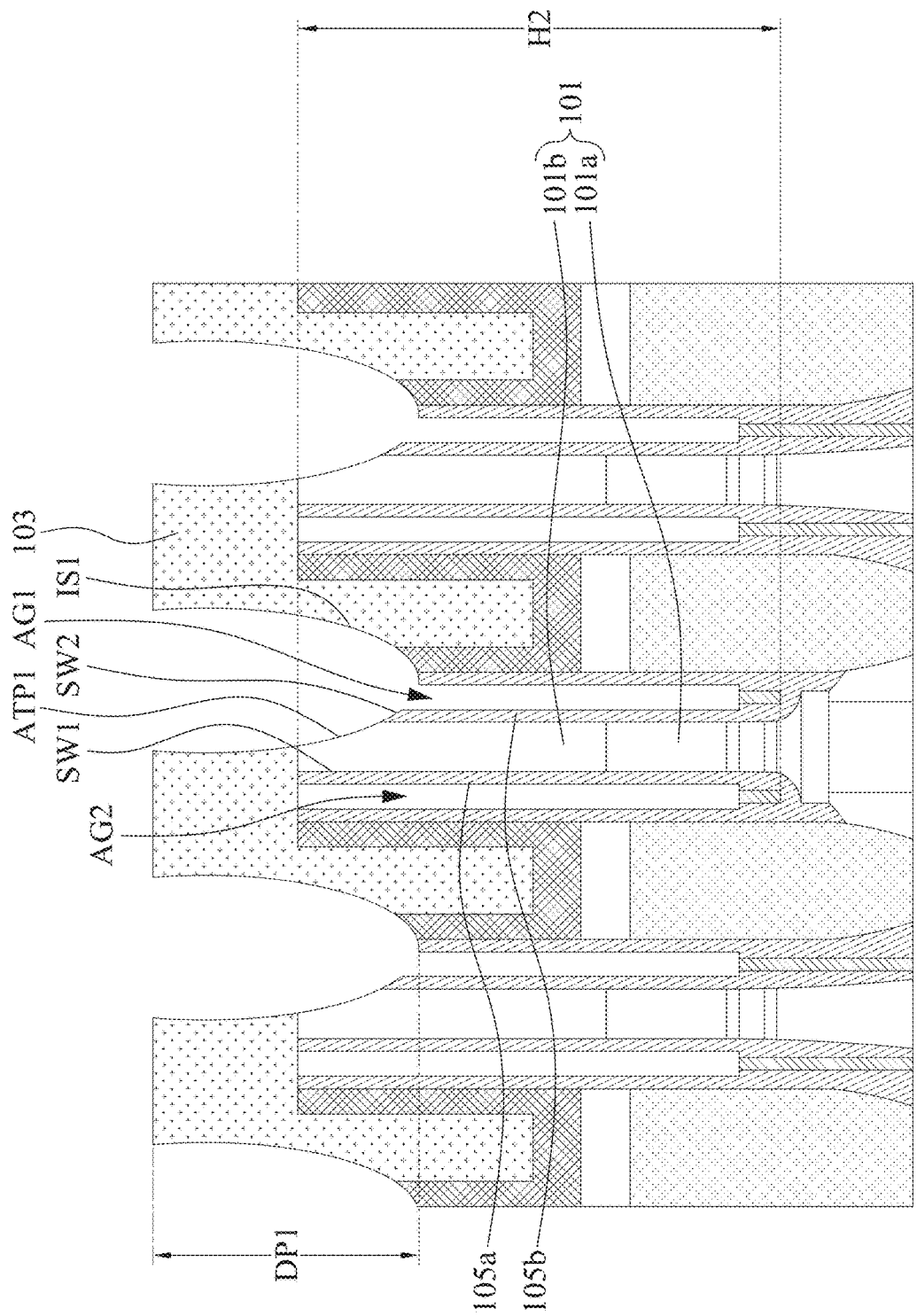
FIG. 6 is a cross-sectional view showing a portion of a semiconductor memory device of the prior art, which comprises a spacer oxide with a relatively large height H2 after the formation of an air gap.

Details shown herein are by way of example and for purposes of illustrative discussion of preferred embodiments of the present invention only and are presented for a purpose of providing what is believed to be a most useful and readily understood description of principles and conceptual aspects of various embodiments of the invention. In this regard, no attempt is made to show structural details of the invention in more detail than is necessary for a fundamental understanding of the invention, and the description taken with the drawings and/or examples should make apparent to those skilled in the art how several forms of the invention may be embodied in practice. Thus, before the disclosed processes and devices are described, it should be understood that aspects described herein are not limited to specific embodiments, apparatuses or configurations, and as such can, of course, vary. It also should be understood that terminology used herein is for a purpose of describing particular aspects only and, unless specifically defined herein, is not intended to be limiting.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the terms "a," "an," "the" and similar referents used in the context of describing the invention (especially in the context of the following claims) are to be construed to cover both the singular and the plural, unless otherwise indicated herein or clearly indicated by context. Unless the context clearly requires otherwise, throughout the description and the claims, the words "comprises," "comprising," and the like are to be construed in an inclusive sense as opposed to an exclusive or exhaustive sense; that is to say, the terms "comprises" and "comprising," when used in this specification, point out the presence of stated features, integers, steps, operations, elements or components, but do not preclude the presence or addition of one or more other features, integers, steps, operations, elements, components or groups thereof.

Groupings of alternative elements or embodiments of the invention disclosed herein are not to be construed as limitations. Each member of a group may be referred to and claimed individually or in any combination with other members of the group or other elements found herein. It is anticipated that one or more members of a group may be included in, or deleted from, a group for reasons of convenience and/or patentability.

Further, spatially relative terms, such as "beneath," "below," "lower," "above," "over," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etching or other removal process. The mask can be a photoresist or a hard mask. In some embodiments, a patterning process is adopted to form a patterned layer directly on a surface. The patterning process includes forming a photosensitive film on the surface, conducting a photolithography process and performing a developing process. The remaining photosensitive film is retained and integrated into the semiconductor device.

The present disclosure will be described in detail with reference to the accompanying drawings with numbered elements. It should be noted that the drawings are in greatly simplified form and are not drawn to scale. Moreover, dimensions have been exaggerated in order to provide a clear illustration and understanding of the present invention.

Figure 7:
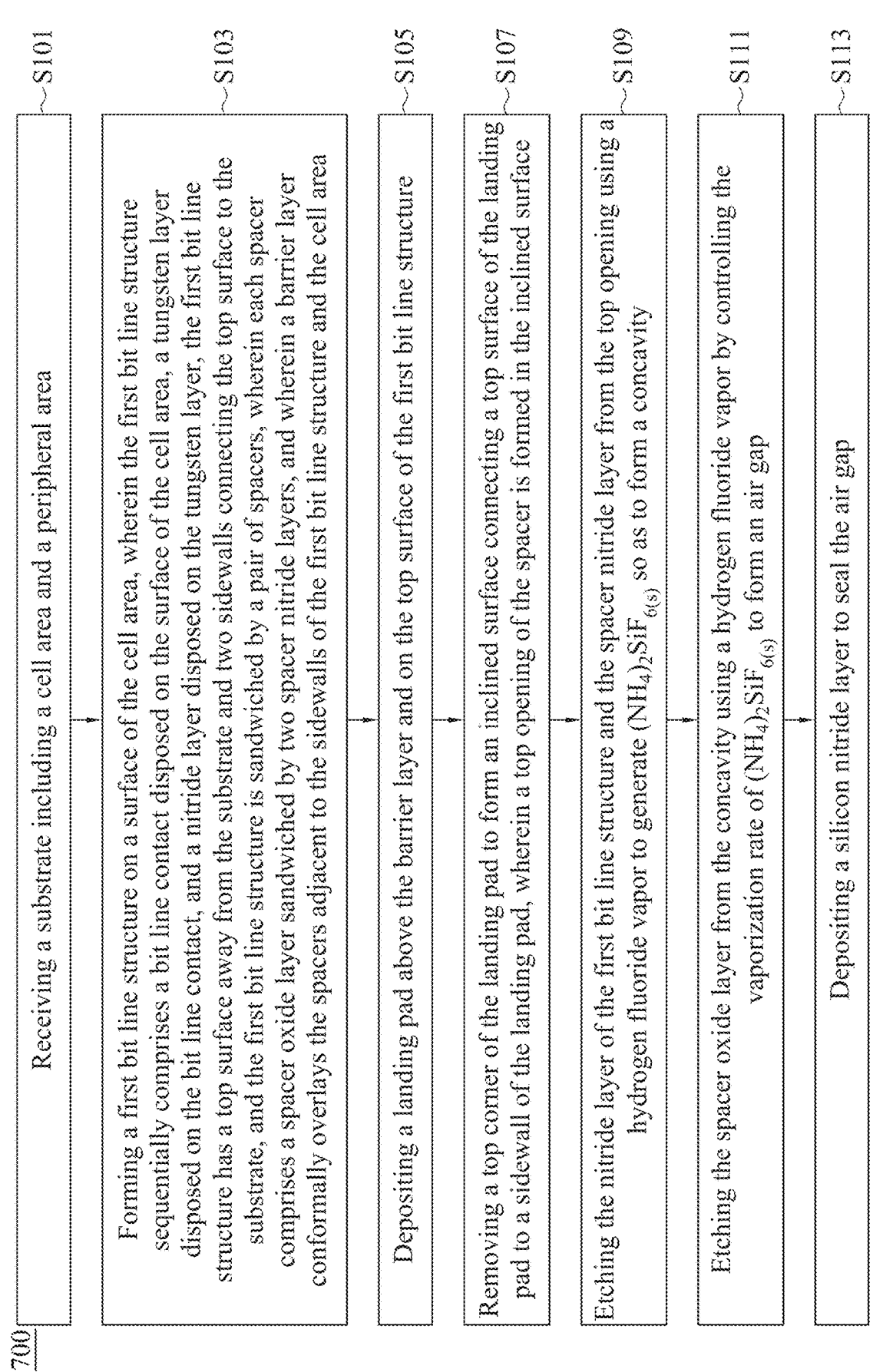
FIG. 7 is a representative flow diagram illustrating a method 700 for manufacturing a semiconductor memory device 800 according to an embodiment of the present disclosure.

FIGS. 1 to 6 are illustrative 3D-perspective views and cross-sectional views of a cell area of a semiconductor memory device 10 with air gaps manufactured according to a conventional method. FIG. 7 is a flow diagram of a method 700 for manufacturing a semiconductor memory device of the present disclosure. FIGS. 8 to 16 are cross-sectional views and SEM images showing a portion of a semiconductor structure 801 during an intermediate stage or after performing steps of the method in accordance with some embodiments of the present disclosure.

Figure 8:
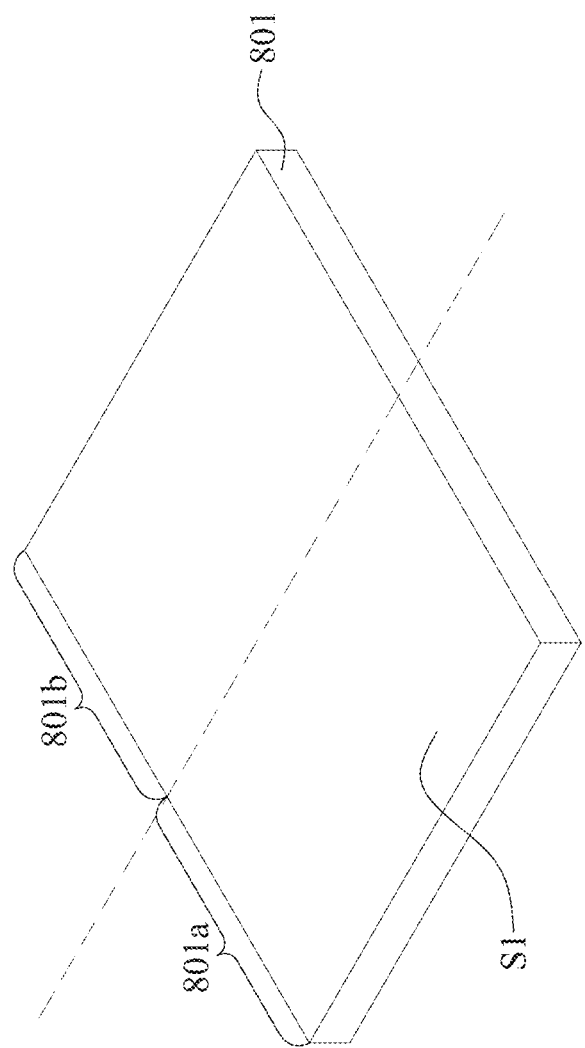
FIG. 8 is a perspective view showing a portion of a semiconductor memory device according to an embodiment of the present disclosure after performing of step S101 in FIG. 7.

Referring to FIG. 8, in step S101, a substrate 801 including a cell area 801a and a peripheral area 801b is provided. In the present disclosure, the term "substrate" means and includes a base material or construction upon which materials are formed. It will be appreciated that the substrate may include a single material, a plurality of layers of different materials, a layer or layers having regions of different materials or different structures in them, or another similar arrangement. These materials may include semiconductors, insulators, conductors or combinations thereof. For example, the substrate 801 may be a semiconductor substrate, a base semiconductor layer on a supporting structure, a metal electrode, or a semiconductor substrate having one or more layers, structures or regions formed thereon. The substrate 801 may be a semiconductor wafer such as a silicon wafer. Alternatively or additionally, the substrate 801 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium and/or diamond. Examples of the compound semiconductor materials may include, but are not limited to, silicon carbide, gallium arsenic, gallium phosphide, indium phosphide, indium arsenide and/or indium antimonide. Examples of the alloy semiconductor materials may include, but are not limited to, SiGe, GaAsP, AlInAs, AlGaAs, GaInAs, GaInP and/or GaInAsP. In some embodiments, the substrate 801 may be a silicon substrate, a gallium arsenide substrate, a silicon germanium substrate, a ceramic substrate, a quartz substrate, a glass substrate, a silicon-on-insulator (SOI) substrate, or the like. In some embodiments, the substrate 801 is a multi-layer structure including a polysilicon layer and a metal layer stacked on the substrate 801 in sequence. In some embodiments, the substrate 801 comprises a metal layer.

Figure 9:
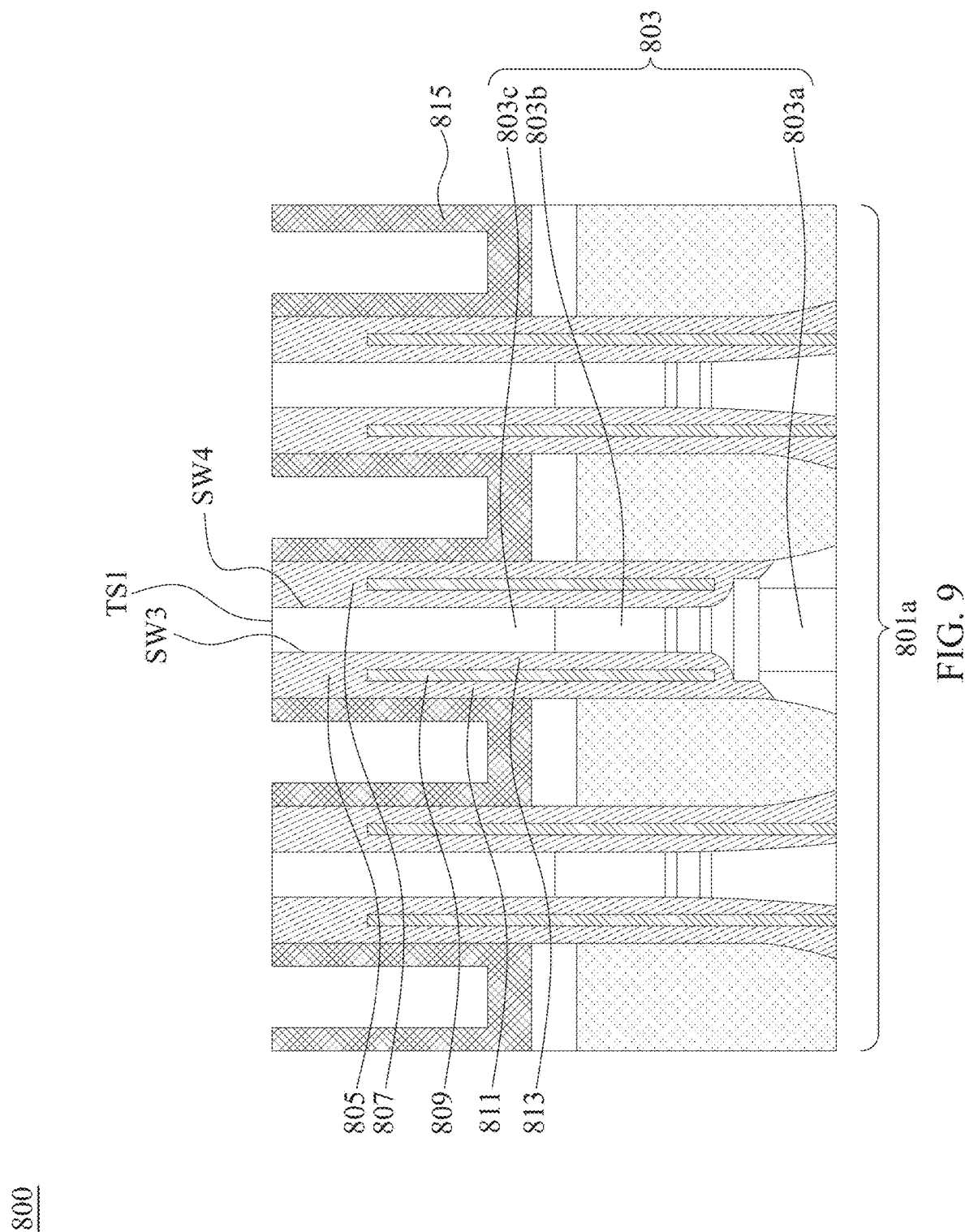
FIG. 9 is a cross-sectional view showing a portion of a semiconductor memory device according to an embodiment of the present disclosure after performing of step S103 in FIG. 7.

Referring to FIG. 9, in step S103, a first bit line structure 803 is formed on a surface 51 of the cell area 801a, wherein the first bit line structure 803 sequentially comprises a bit line contact 803a disposed on the surface 51 of the cell area 801a, a tungsten layer 803b disposed on the bit line contact 803a, and a nitride layer 803c disposed on the tungsten layer 803b, the first bit line structure 803 has a top surface TS1 away from the substrate 801 and two sidewalls SW3 and SW4 connecting the top surface TS1 of the first bit line structure 803 to the substrate 801, and the first bit line structure 803 is sandwiched by a pair of spacers 805 and 807, wherein each spacer 805 or 807 comprises a spacer oxide layer 809 sandwiched by two spacer nitride layers 811 and 813, and wherein a barrier layer 815 conformally overlays the spacers 805 and 807 adjacent to the sidewalls SW3 and SW4 of the first bit line structure 803 and the cell area 801a. In some embodiments, the first bit line structure 803 is a pillar having a rounded top. In some embodiments, the first bit line structure 803 includes a sidewall, an ascending top portion, a top portion and a descending portion. In some embodiments, the ascending top portion, the top portion and the descending portion together form the rounded top.

In some embodiments, the semiconductor structure 800 further includes an adhesion layer (not shown in the figures) disposed over the substrate 801 between adjacent pairs of bit line structures 803. The adhesion layer is for a purpose of increased adhesion between a landing pad 817 (to be formed in a later processing step) and the barrier layer 815 to prevent peeling off of the landing pad 817.

In step S103, the barrier layer 815 may be formed of, for example, silicon oxide, silicon oxynitride, silicon nitride oxide, silicon nitride, or the like. It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen. Optionally, a cleaning process using a reducing agent may be optionally performed to remove the defects from the substrate 801. The reducing agent may be titanium tetrachloride, tantalum tetrachloride, or a combination thereof.

Figure 10:
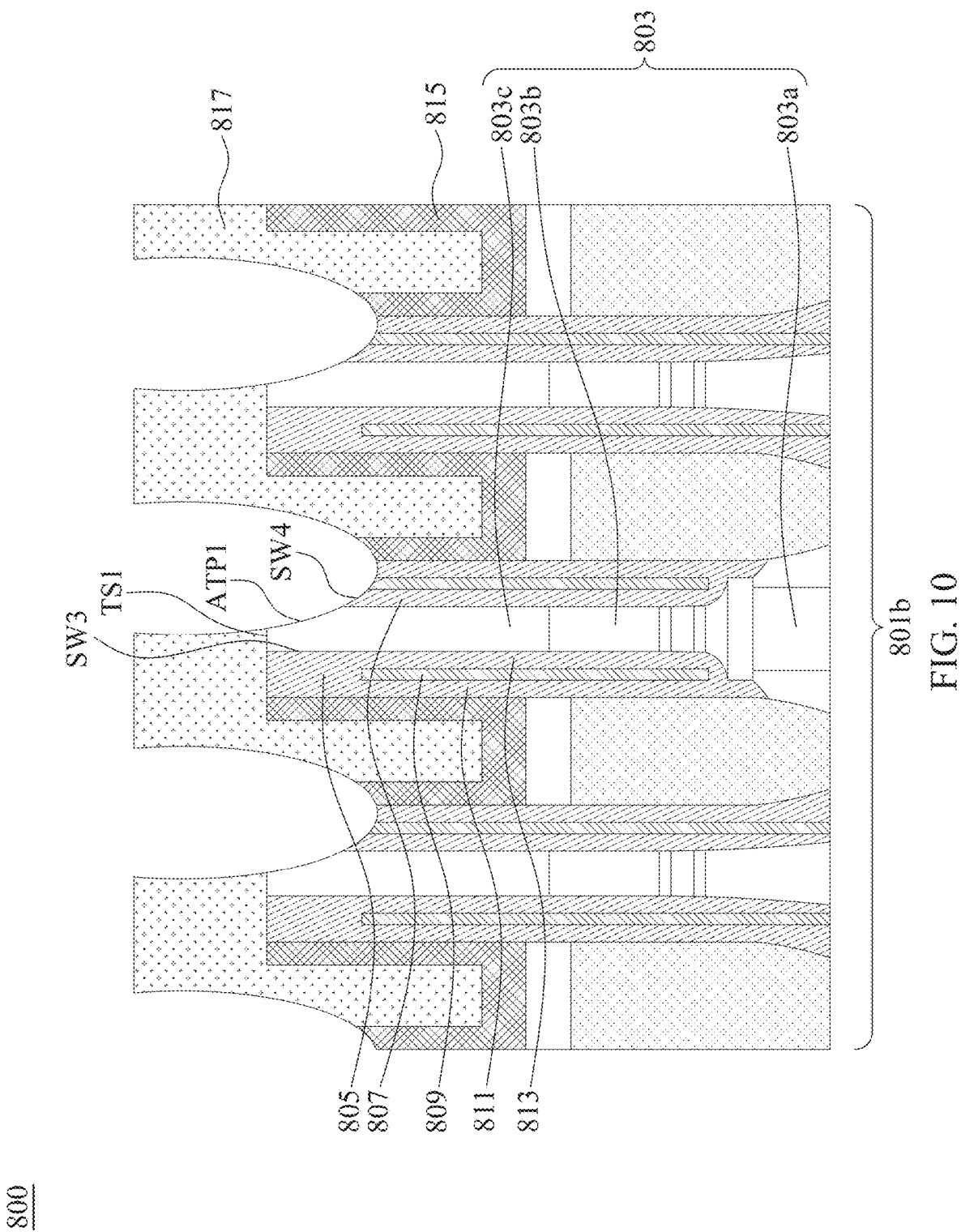
FIG. 10 is a cross-sectional view showing a portion of a semiconductor memory device according to an embodiment of the present disclosure after performing of step S105 in FIG. 7.

Referring to FIG. 10, in step S105, a landing pad 817 is deposited above the barrier layer 815 and on the top surface TS1 of the first bit line structure 803. In step S105, a process such as atomic layer deposition (ALD), atomic layer epitaxy (ALE), atomic layer chemical vapor deposition (ALCVD), spin-coating, sputtering or the like can be used to apply the landing pad 817 above the barrier layer 815 and on the top surface TS1 of the first bit line structure 803. According to a preferred embodiment of the present disclosure, the step of depositing the landing pad 817 above the barrier layer 815 and on the top surface TS1 of the first bit line structure 803 is performed using ALD. Optionally, a planarization process, such as chemical mechanical polishing, may be performed after step S105.

Figure 11:
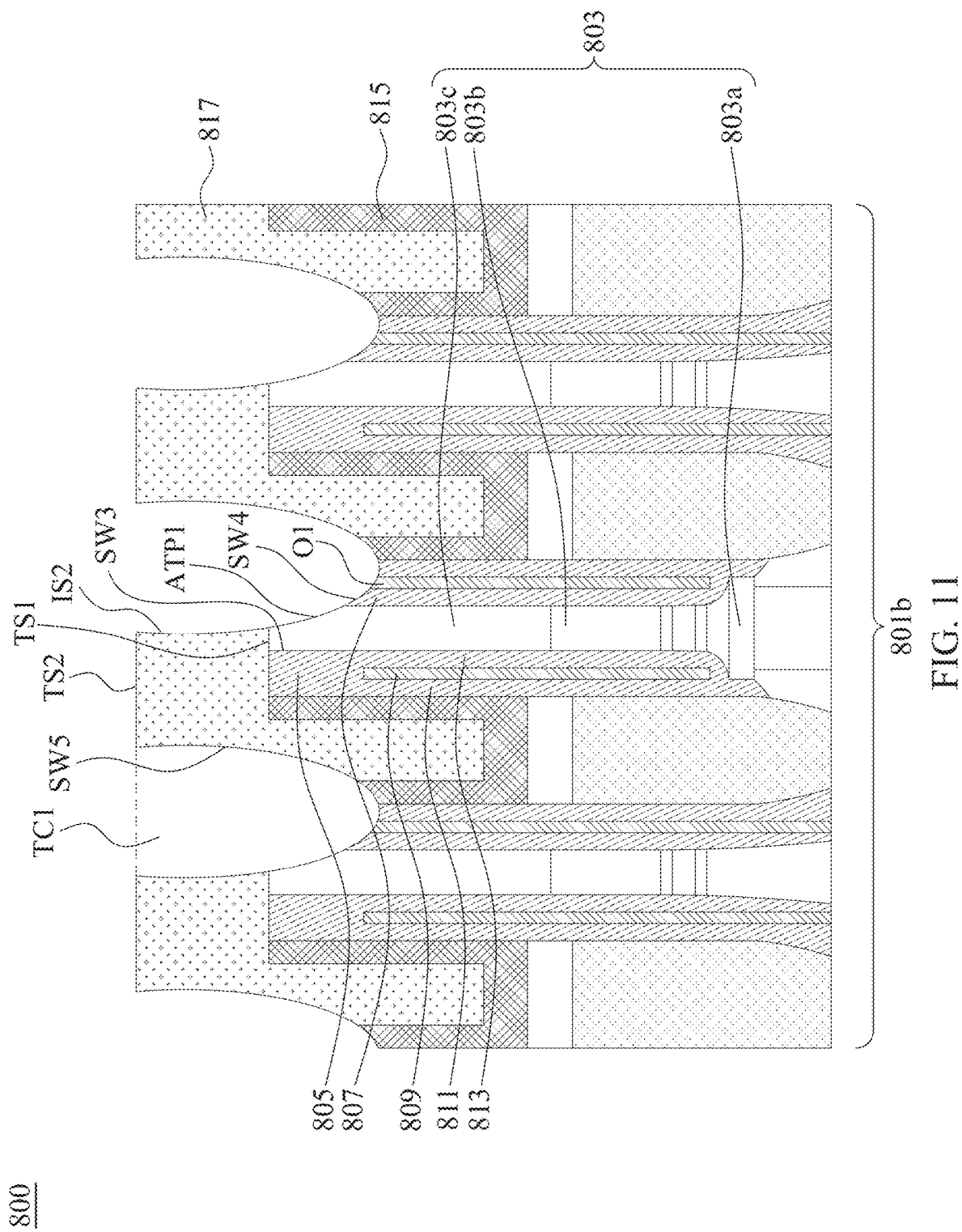
FIG. 11 is a cross-sectional view showing a portion of a semiconductor memory device according to an embodiment of the present disclosure after performing of step S107 in FIG. 7.

Referring to FIG. 11, in step S107, a top corner TC1 of the landing pad 817 is removed to form an inclined surface IS2 connecting a top surface TS2 to a sidewall SW5 of the landing pad 817. A top opening O1 of the spacer 805 or 807 is formed in the inclined surface IS2. In some embodiments of the present disclosure, the inclined surface IS2 is a convex surface. In step S107, an etching process, such as an anisotropic dry etch process or a post reactive ion etching (RIE) process, may be performed to remove the top corner TC1 of the landing pad 817. In some embodiments of the present disclosure, a spacer etching is performed to remove the top corner TC1 of the landing pad 817, and the inclined surface IS2 is a convex surface. In some embodiments of the present disclosure, a directional etching is performed to remove the top corner TC1 of the landing pad 817 in FIG. 11. In some embodiments, multiple etching operations are performed to achieve a desired configuration or a combined configuration of the inclined surface IS2 of the landing pad 817. In some embodiments, a tilt dry-etching is performed to remove the top corner TC1 of the landing pad 817.

Figure 12:
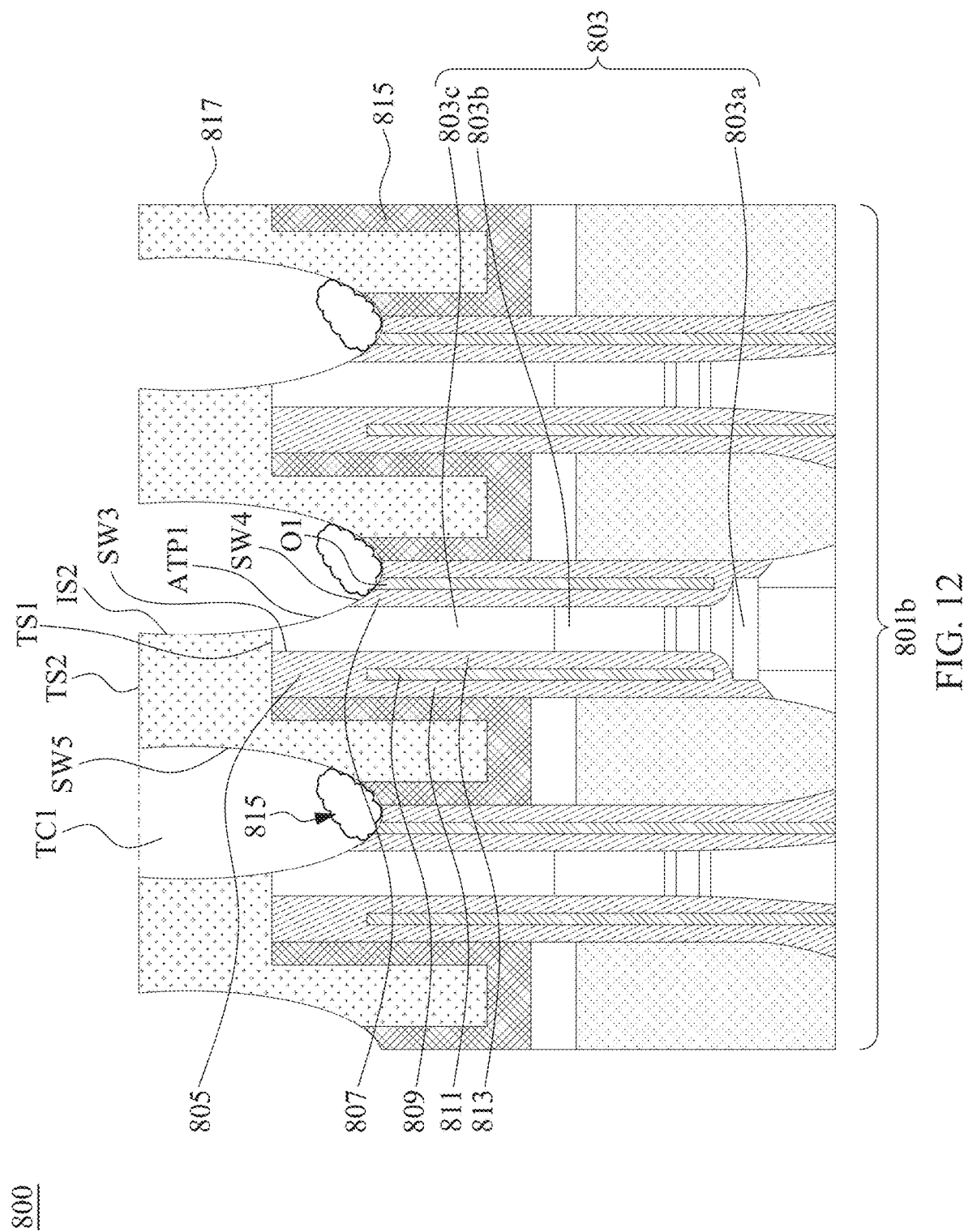
FIG. 12 is a cross-sectional view showing a portion of a semiconductor memory device according to an embodiment of the present disclosure during an intermediate stage of step S109 in FIG. 7.
Figure 13:
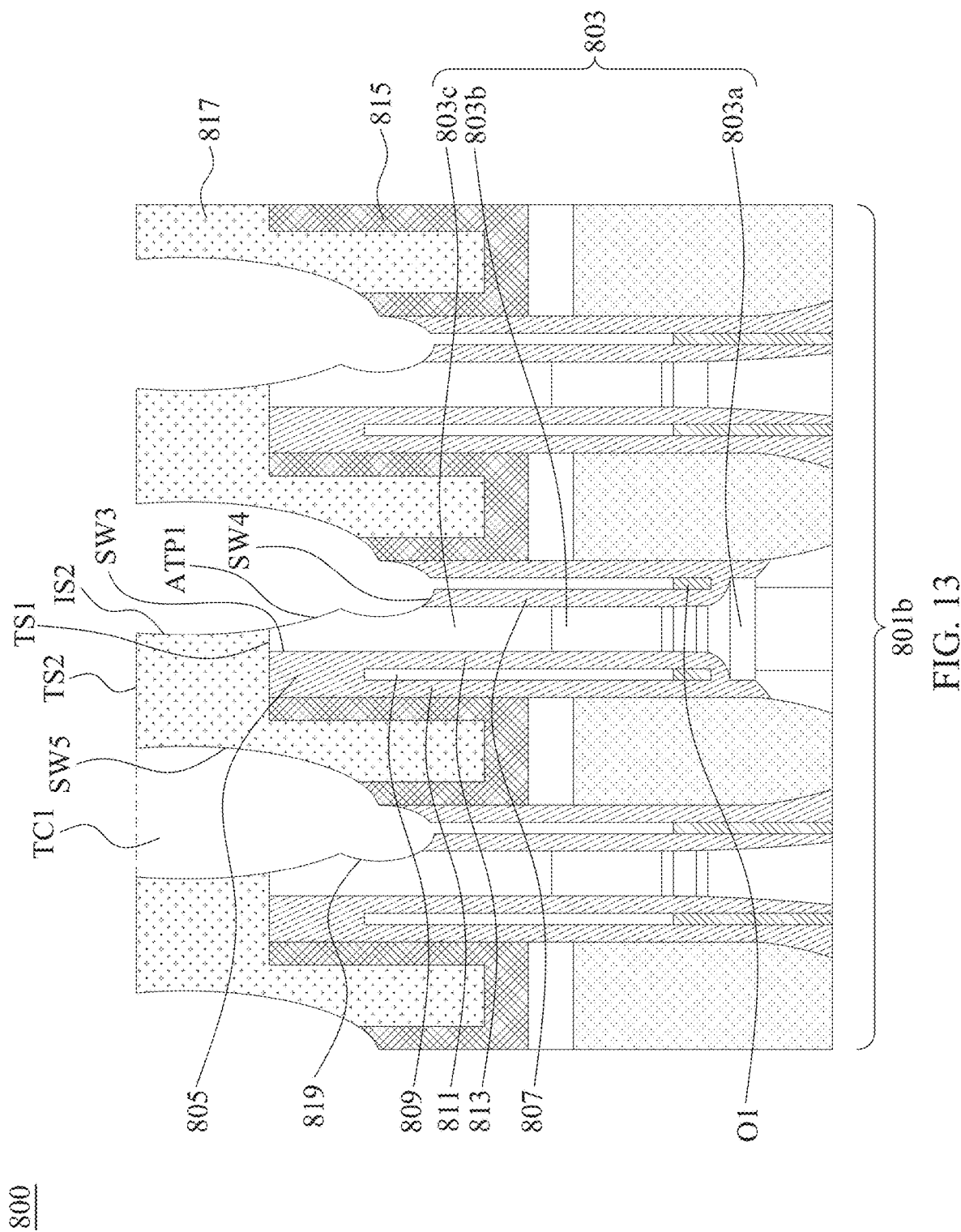
FIG. 13 is a cross-sectional view showing a portion of a semiconductor memory device according to an embodiment of the present disclosure after performing of step S109 in FIG. 7.

Referring to FIGS. 12 and 13, in step S109, an etching process is performed on the nitride layer 803c of the first bit line structure 803 and the spacer nitride layer 811 or 813 from the top opening O1 using a hydrogen fluoride vapor to form a concavity 819. The following reactions occur at the beginning of step S109 to generate $(NH_4)_2SiF_{6(s)}$:

1. $SiO_{2(s)} + 4HF_{(g)} \rightarrow SiF_{4(g)} + 2H_{2(g)}$
2. $SiF_{4(g)} + 2HF_{(g)} + 2NH_{3(g)} \rightarrow (NH_4)_2SiF_{6(s)}$
3. $(NH_4)_2SiF_{6(s)} \rightarrow SiF_{4(g)} + 2HF_{(g)} + 2NH_{3(g)}$ As shown in FIG. 12, at the end of reaction 2, $(NH_4)_2SiF_{6(s)}$ is generated on the top opening O1 of the spacer 805 or 807. This chemical substance begins to decompose and surrounds the nitride layer 803c of the first bit line structure 803 and the spacer nitride layer 811 or 813 so that an etching rate is enhanced. As shown in FIG. 13, a concavity 819 is formed after the performing of step S109.

Figure 14:
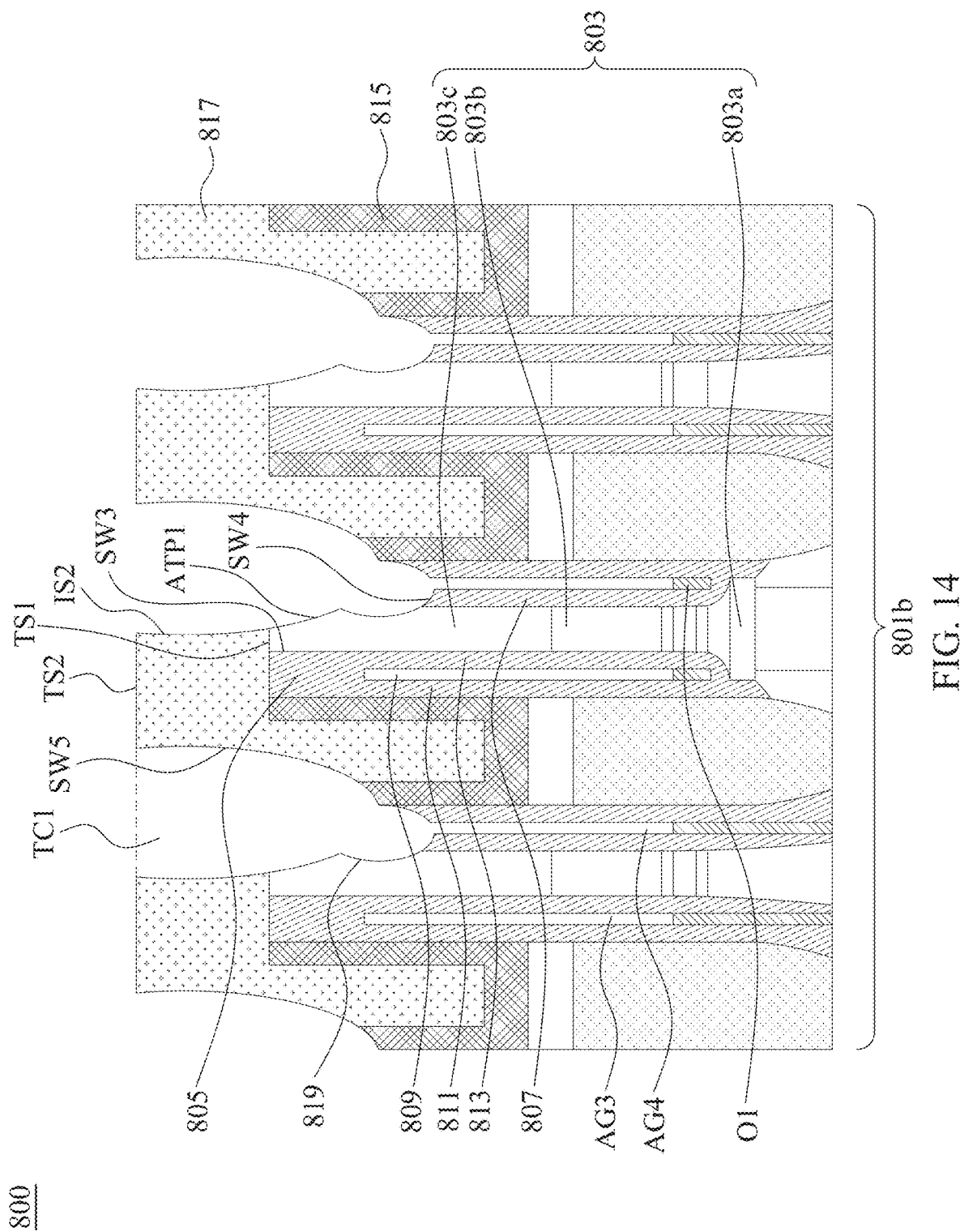
FIG. 14 is a cross-sectional view showing a portion of a semiconductor memory device according to an embodiment of the present disclosure after performing of step S111 in FIG. 7.

Referring to FIG. 14, in step S111, an etching process is performed on the spacer oxide layer 809 from the concavity 819 using a hydrogen fluoride vapor. An etching process, such as an anisotropic dry etch process or a post reactive ion etching (RIE) process, may be performed in step S111. By controlling the vaporization rate of $(NH_4)_2SiF_{6(s)}$ in step S111, a desired profile of an air gap AG3 is obtained. In the present disclosure, the term "air gap" is used to denote a cavity which may be filled with air, with a gas other than air, or in particular with an inert gas such as argon, or which may otherwise be a vacuum.

Figure 15:
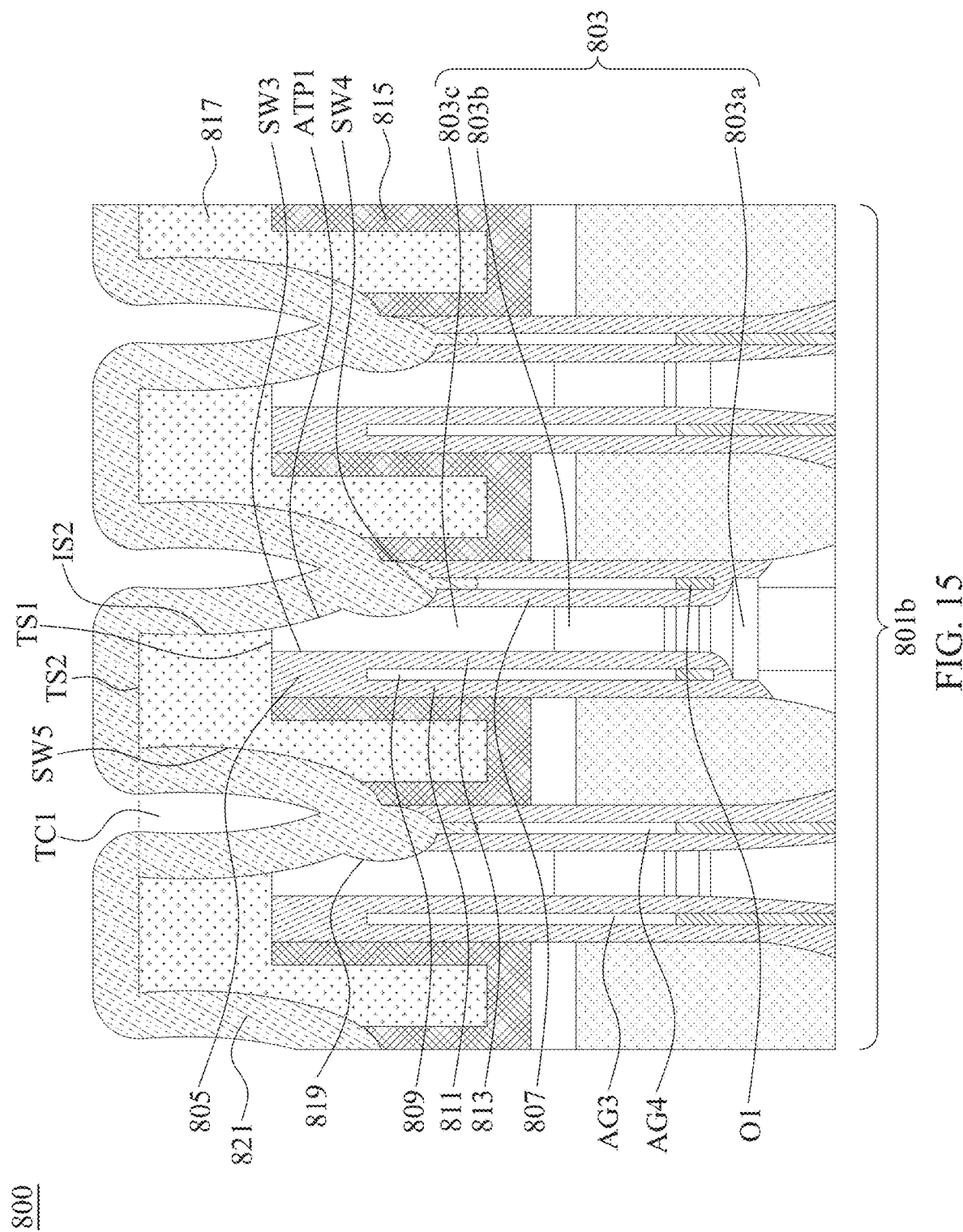
FIG. 15 is a cross-sectional view showing a portion of a semiconductor memory device according to an embodiment of the present disclosure after performing of step S113 in FIG. 7.

Referring to FIG. 15, in step S113, a silicon nitride layer 821 is deposited on the semiconductor memory device 800 to seal the air gap AG4. A process such as atomic layer deposition (ALD), atomic layer epitaxy (ALE), atomic layer chemical vapor deposition (ALCVD), spin-coating, sputtering or the like can be used to apply the silicon nitride layer 821 on the semiconductor memory device 800 to seal the air gap AG3. According to a preferred embodiment of the present disclosure, the step of depositing the silicon nitride layer 821 on the semiconductor memory device 800 is performed using ALD. Optionally, a planarization process, such as chemical mechanical polishing, may be performed after step S113.

Figure 16:
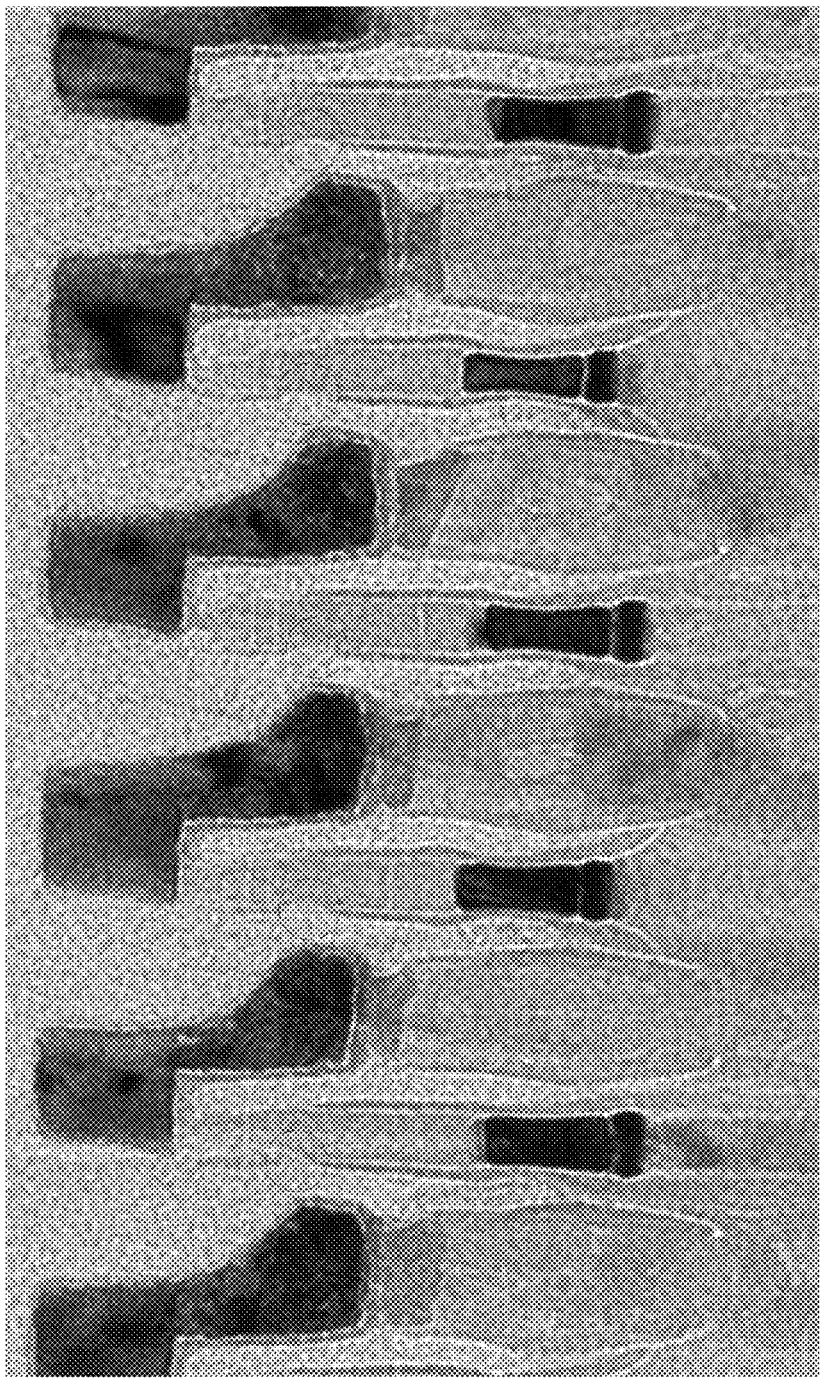
FIG. 16 is an SEM image showing a portion of a semiconductor memory device according to an embodiment of the present disclosure after the performing of step S113 in FIG. 7.

FIG. 16 is an SEM image showing a portion of a semiconductor memory device according to an embodiment of the present disclosure after the performing of step S113 in FIG. 7. A concavity is formed on the nitride layer of the first bit line structure and the spacer nitride layer.

Due to the design of the method of the present disclosure, $(NH_4)_2SiF_{6(s)}$ is formed on a top opening of a spacer. This chemical substance begins to decompose and surrounds a nitride layer of a first bit line structure and a spacer nitride layer so that an etching rate is enhanced. By controlling a vaporization rate of $(NH_4)_2SiF_{6(s)}$ in a subsequent step of etching the spacer oxide layer, a desired profile of an air gap can be obtained. As a result, problems encountered in the prior art, such as difficulties associated with a size of an open area of a spacer oxide and HF vapor etching time, current leakage and other issues are addressed by the method of the present disclosure. In addition, there is no need to use an additional patterning process to form separate cell and periphery areas for the method of the present disclosure.

Although the present disclosure and its advantages have been described in detail, it should be understood that various changes, substitutions and alterations can be made herein without departing from the spirit and scope of the present disclosure as defined by the appended claims. For example, certain particular embodiments of the present disclosure may include the best mode known to the inventors for carrying out the invention. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor memory device, comprising:
receiving a substrate including a cell area and a peripheral area;
forming a first bit line structure on a surface of the cell area, wherein the first bit line structure sequentially comprises a bit line contact disposed on the surface of the cell area, a tungsten layer disposed on the bit line contact, and a nitride layer disposed on the tungsten layer, the first bit line structure has a top surface away from the substrate and two sidewalls connecting the top surface to the substrate, and the first bit line structure is sandwiched by a pair of spacers, wherein each spacer comprises a spacer oxide layer sandwiched by two spacer nitride layers, and wherein a barrier layer conformally overlays the spacers adjacent to the sidewalls of the first bit line structure and the cell area;
depositing a landing pad above the barrier layer and on the top surface of the first bit line structure;
removing a top corner of the landing pad to form an inclined surface connecting a top surface of the landing pad to a sidewall of the landing pad, wherein a top opening of the spacer is formed in the inclined surface;
etching the nitride layer of the first bit line structure and the spacer nitride layer from the top opening so as to form a concavity;
etching the spacer oxide layer from the concavity to form an air gap; and
depositing a silicon nitride layer to seal the air gap.

2. The method according to claim 1, wherein the substrate is a silicon substrate, a gallium arsenide substrate, a silicon germanium substrate, a ceramic substrate, a quartz substrate, a glass substrate or a silicon-on-insulator (SOI) substrate.

3. The method according to claim 1, wherein the substrate is a multi-layer structure including a polysilicon layer and a metal layer stacked on the substrate in sequence.

4. The method according to claim 1, wherein the substrate comprises a metal layer.

5. The method according to claim 1, further comprising carrying out a cleaning process using a reducing agent prior to the step of depositing a landing pad above the barrier layer and on the top surface of the first bit line structure, wherein the reducing agent is selected from the group consisting of titanium tetrachloride, tantalum tetrachloride, and combinations thereof.

6. The method according to claim 1, wherein the step of depositing a landing pad above the barrier layer and on the top surface of the first bit line structure is performed using atomic layer deposition (ALD).

7. The method according to claim 1, further comprising carrying out a planarization process after the performing of the step of depositing a landing pad above the barrier layer and on the top surface of the first bit line structure.

8. The method according to claim 1, wherein a spacer etching is performed to remove the top corner of the landing pad, and the inclined surface is a convex surface.

9. The method according to claim 1, wherein the step of etching the nitride layer of the first bit line structure and the spacer nitride layer from the top opening using a hydrogen fluoride vapor is performed using an anisotropic dry etch process.

10. The method according to claim 1, wherein the step of etching the nitride layer of the first bit line structure and the spacer nitride layer from the top opening so as to form a concavity is performed using a hydrogen fluoride vapor to generate $(NH_4)_2SiF_{6(s)}$, and the step of etching the spacer oxide layer from the concavity to form an air gap is performed using a hydrogen fluoride vapor by controlling the vaporization rate of $(NH_4)_2SiF_{6(s)}$.

11. The method according to claim 1, wherein the step of depositing a silicon nitride layer to seal the air gap is performed using atomic layer deposition (ALD).

12. The method according to claim 1, wherein a directional etching is performed to remove the top corner of the landing pad, and the inclined surface is a concave surface.

13. The method according to claim 1, wherein a tilt dry-etching is performed to remove the top corner of the landing pad.

14. A method of manufacturing a semiconductor memory device, comprising:
receiving a silicon substrate including a cell area and a peripheral area;
forming a first bit line structure on a surface of the cell area, wherein the first bit line structure sequentially comprises a bit line contact disposed on the surface of the cell area, a tungsten layer disposed on the bit line contact, and a nitride layer disposed on the tungsten layer, the first bit line structure has a top surface away from the substrate and two sidewalls connecting the top surface to the substrate, and the first bit line structure is sandwiched by a pair of spacers, wherein each spacer comprises a spacer oxide layer sandwiched by two spacer nitride layers, and wherein a barrier layer conformally overlays the spacers adjacent to the sidewalls of the first bit line structure and the cell area;

performing an atomic layer deposition (ALD) to deposit a landing pad above the barrier layer and on the top surface of the first bit line structure;

performing a directional etching to remove a top corner of the landing pad to form a concave surface with a top opening of the spacer formed in the concave surface;

performing an anisotropic dry etch process to etch the nitride layer of the first bit line structure and the spacer nitride layer from the top opening so as to form a concavity;

etching the spacer oxide layer from the concavity to form an air gap; and depositing a silicon nitride layer to seal the air gap.

15. The method according to claim 14, wherein the silicon substrate is a multi-layer structure including a polysilicon layer and a metal layer stacked on the substrate in sequence.

16. The method according to claim 14, further comprising carrying out a cleaning process using a reducing agent prior to the step of performing an atomic layer deposition (ALD) to deposit a landing pad above the barrier layer and on the top surface of the first bit line structure, wherein the reducing agent is selected from the group consisting of titanium tetrachloride, tantalum tetrachloride, and combinations thereof.

17. The method according to claim 14, wherein the step of etching the nitride layer of the first bit line structure and the spacer nitride layer from the top opening so as to form a concavity is performed using a hydrogen fluoride vapor to generate $(NH_4)_2SiF_{6(s)}$, and the step of etching the spacer oxide layer from the concavity to form an air gap is performed using a hydrogen fluoride vapor by controlling the vaporization rate of $(NH_4)_2SiF_{6(s)}$.

18. The method according to claim 14, further comprising carrying out a planarization process after the performing of the step of performing an atomic layer deposition (ALD) to deposit a landing pad above the bather layer and on the top surface of the first bit line structure.

19. The method according to claim 14, wherein the step of depositing a silicon nitride layer to seal the air gap is performed using atomic layer deposition (ALD).

* * * * *